United States Patent [19]

Vasilinina et al.

[11] 4,211,581

[45] Jul. 8, 1980

[54] SOLAR PHOTOELECTRIC CONVERSION APPARATUS WITH COOLING MEANS

[76] Inventors: Olga V. Vasilinina, ulitsa Maslova 6, kv. 49, Monino Moskovskoi oblasti; Jury K. Kidyashev, ulitsa Bazhova, 15, korpus 1, kv. 195, Moscow; Valery N. Potapov, ulitsa Timiryazevskaya, 13, kv. 213, Moscow; Stanislav V. Ryabikov, pereulok Vasnetsova, 12, kv. 64, Moscow; Anatoly M. Stepanov, 1 mikroraion, ulitsa Repina, 10, kv. 18, Ashkhabad; Dmitry S. Strebkov, Kirovogradsky proezd, 3, korpus 1, kv. 17, Moscow, all of U.S.S.R.

[21] Appl. No.: 28,900

[22] Filed: Apr. 10, 1979

[51] Int. Cl.² .................................................. H01L 31/04
[52] U.S. Cl. ........................... 136/89 CA; 136/89 PC; 357/82
[58] Field of Search ........ 136/89 PC, 89 HY, 89 CA; 357/82

[56] References Cited

U.S. PATENT DOCUMENTS

| | | | |
|---|---|---|---|
| 3,988,166 | 10/1976 | Beam | 136/89 |
| 3,990,914 | 11/1976 | Weinstein et al. | 136/89 |
| 4,045,246 | 8/1977 | Mlavsky et al. | 136/89 PC |
| 4,052,228 | 10/1977 | Russell | 136/89 PC |
| 4,081,289 | 3/1978 | Campbell | 136/89 PC |
| 4,144,095 | 3/1979 | Mlavsky | 136/89 PC |
| 4,146,407 | 3/1979 | Litsenko et al. | 136/89 PC |

OTHER PUBLICATIONS

W. Masters et al., "A Novel Low-Cost Photovoltaic Concentrator," Conf. Record, *13th IEEE Photovoltaic Specialists Conf.* (1978), pp. 686–689.

*Primary Examiner*—Aaron Weisstuch
*Attorney, Agent, or Firm*—Steinberg & Blake

[57] ABSTRACT

A solar photoelectric conversion apparatus comprises a light converter immersed in a transparent liquid heat carrier which occupies the lower part of the cavity of a hollow hermetically sealed reservoir. The apparatus also includes a solar radiation concentrator inserted in a beam of a solar radiation incident on an active surface of the light converter.

During operation of the apparatus, vapors of the heat carrier condense on the inner walls of the reservoir and return by gravity to the liquid in the lower portion of the cavity, thereby cooling the liquid and the light converter immersed therein by "thermal siphon" action.

1 Claim, 3 Drawing Figures

U.S. Patent
Jul. 8, 1980
4,211,581
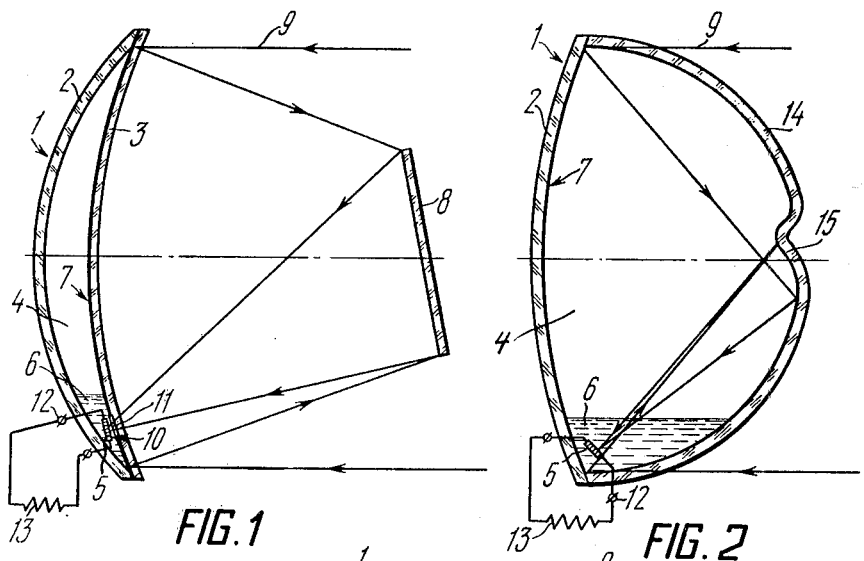
FIG. 1
FIG. 2
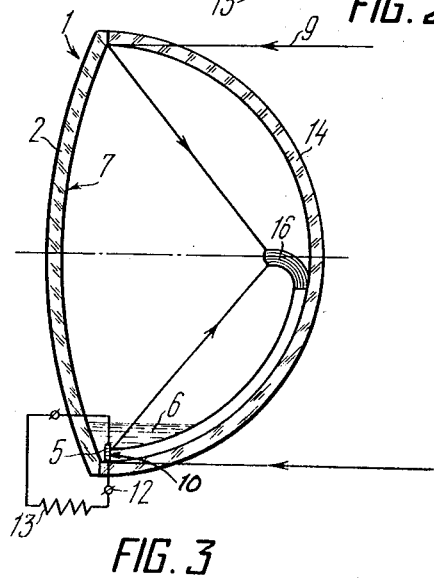
FIG. 3

SOLAR PHOTOELECTRIC CONVERSION APPARATUS WITH COOLING MEANS

FIELD OF THE INVENTION

The invention relates to apparatus for converting solar radiation into electric energy, and more particularly to solar photoelectric conversion apparatuses, which are preferably suitable for ground-based power installations to be mounted at difficult-to-reach locations.

DESCRIPTION OF THE PRIOR ART

Known in the art is a solar radiation conversion apparatus comprising a light converter, a solar radiation concentrator inserted in a beam of solar radiation incident on the active light-sensitive surface of a light converter, and means for cooling the light converter (cf. U.S. Pat. No. 3,383,246, cl. 136-89). The cooling means is a turn-table that has its shaft coupled with an electric motor. The light converter is mounted on top of the turn-table and rotates together with it so as to periodically leave the irradiation zone. This provides for the cooling of the light converter. As a result, the light converter is operated in a pulsed mode when cooling intervals are provided. In addition, the electric motor requires electric power and causes reduced reliability of the cooling means since the rotatable subassemblies must be lubricated periodically and their worn parts must be replaced.

There is another sun-heat photoelectric conversion unit comprising a light converter submerged in a transparent heat carrier which is accommodated in a hollow hermetically sealed reservoir (cf. U.S. Pat. No. 4,146,407).

In the known apparatus, the concentrator is a hollow hermetically sealed reservoir in the form of a lens filled with a heat carrier. The light converter is cooled by convective heat removal taking place in the heat carrier and is operated in a continuous mode.

The convective heat removal is an adequate means of cooling the light converter at sun-heat concentration factors not exceeding a value of 100. At higher values of this factor, the convective heat removal cannot provide for effective cooling, with the result that the output of the known apparatus is reduced.

Moreover, the known apparatus is very heavy on account of the heat carrier that fills the cavity of the reservoir.

SUMMARY OF THE INVENTION

An object of the invention is to provide for greater output of a solar photoelectric conversion apparatus.

Another object of the invention is to provide for decreased weight of a solar photoelectric conversion apparatus.

There is disclosed a solar photoelectric conversion apparatus comprising a light converter immersed in a heat carrier that is accommodated in a hollow hermetically sealed reservoir, and also comprising a solar radiation concentrator inserted in a beam of solar radiation incident upon an active surface of the light converter. The heat carrier, according to the invention, occupies only part of the cavity of the reservoir.

The apparatus of the invention provides an increased output due to effective cooling attained by the use of a thermal siphon without additional electric power consumption, thereby resulting in a decrease in the apparatus weight amounting to 30-40%.

DESCRIPTION OF THE INVENTION

The invention will now be described in more detail, by way of example, with reference to the accompanying drawings in which:

FIG. 1 is a longitudinal section of a solar photoelectric conversion unit with a mirror paraboloid reflector and an auxiliary reflector which is disposed outside the reservoir, according to the invention;

FIG. 2 is a longitudinal section of the construction shown in FIG. 1 with an auxiliary reflector disposed on the reservoir wall, according to the invention;

FIG. 3 is a longitudinal section of the construction shown in FIG. 1 with an auxiliary reflector implemented as a fiber glass guide.

DESCRIPTION OF THE INVENTION

The solar photoelectric conversion apparatus of the invention (FIG. 1) comprises a hollow hermetically sealed reservoir 1 having a convex wall 2 and a concave wall 3. In the lower portion of a cavity 4 of the reservoir 1 there is a light converter 5 immersed in a transparent heat carrier 6 having a low boiling point, which may, be, for example, freon-113 having a boiling point of 475° C. The heat carrier occupies part of the cavity 4 which is sufficient for the light converter to be fully immersed in the heat carrier 6. The concave wall 3 of the reservoir 1 is a mirror paraboloid reflector (referred to as a mirror reflector 3). To this end, an aluminum film is deposited on the inner surface of the wall 3 so as to form a mirror coating 7. A flat mirror auxiliary reflector 8 opposite to the mirror reflector 3 is positioned outside of the reservoir 1 so that solar radiation 9, when reflected by the reflector 3, impinges on the reflector 8 which directs it on to a working surface of the light converter 5.

There is a transparent window 11, opposite to the active surface 10 of the light converter 5, in the mirror reflector 3 which passes the reflected light. The reflectors 3,8 together form a solar radiation concentrator. The light converter has power leads 12 running out of the reservoir 1 without distrubing its hermetic condition coupled to the leads of a load 13.

FIG. 2 shows another modification of the apparatus of the invention in which the mirror coating is applied on the inner surface of the convex wall 2 of the reservoir 1, said surface facing the solar radiation 9, and the opposite wall 14 is made as a convex one. An auxiliary reflector 15 on a portion of the inner surface of transparent wall 14 is used to direct the light beam reflected from the paraboloid reflector to the active surface 10 of the light converter 5 which is positioned in the lower portion of the cavity 4 of the reservoir 1. The reflector 15 is a mirror coating deposited on an appropiate area of the wall 14.

The apparatus of the invention shown in FIG. 3 utilizes as an auxiliary reflector a fiber glass guide 16 mounted within the reservoir 1, the entrance end of the guide 16 being positioned at the focal point of the mirror paraboloid reflector, and the exit end of the guide 16 being adjacent the active surface 10 of the light converter 5.

The apparatus of the invention operates in the following manner.

The solar radiation 9 (FIG. 1) is incident upon the mirror paraboloid reflector 3 and then upon the auxiliary reflector 8 which is used to direct the focused beam of radiation 9 on the active surface 10 of the light converter 5. The electric power produced by the light converter is delivered through the power leads 12 to the load 13. As a result of the above operation the heat carrier absorbs heat, thereby causing the heat carrier to boil and evaporate. The vapors of the heat carrier 9 so produced rise, condense on the inner surfaces of the walls 2, 3 of the reservoir 1 and are led by gravity to the lower portion of the reservoir 1, thereby providing for effective cooling of the light converter 5. This means that the light converter is cooled using the thermal siphon principle in which case the surfaces of the walls of the reservoir 1 are employed for condensation of the heat carrier 6 and for conducting the heat into the atmosphere.

The modifications of the apparatus of the invention shown in FIGS. 2, 3 operate in a manner analogous to that described for the apparatus of FIG. 1. However, the apparatuses of FIGS. 2, 3 offer greater reliability since all their components are protected during operation from the influence of surrounding effects by the envelope of the reservoir 1.

The light converter 5 is cooled on an effective basis, which results in a stable power output of the apparatus while its output is increased by 10 to 15%.

A prototype according to FIG. 1 having a reservoir 0.2 m in diameter and welded from glass material 3.5 mm thick was filled during testing with freon-213. The intensity of solar radiation was 800 W/m$^2$, air temperature was 18° C., and a light converter 10×10 mm in size was maintained at a temperature of from 45° to 50° C. at a solar concentration factor of 100.

What is claimed is:

1. A solar photoelectric conversion apparatus comprising a hollow hermetically sealed reservoir; a transparent liquid heat carrier within said reservoir and occupying the lower portion of the cavity formed by the reservoir; a light converter immersed in said heat carrier and having an active surface; a solar concentrator adapted to be in the optical path of a beam of a solar radiation incident on said active surface of said light converter; and power leads of said light converter running out of said reservoir without disturbing its hermetic condition, whereby during operation of the apparatus vapors of the heat carrier condense on the inner walls of said reservoir and return by gravity to said liquid in said lower portion of said cavity, thereby cooling said liquid and said light converter immersed therein by "thermal siphon" action.

* * * * *